April 15, 1969 W. C. SEELBACH 3,439,186

DIODE TRANSISTOR LOGIC CIRCUIT HAVING IMPROVED TURN-ON DRIVE

Filed Oct. 18, 1965

INVENTOR.
Walter C. Seelbach

BY

Mueller, Aichele & Rauner

ATTY'S.

United States Patent Office
3,439,186
Patented Apr. 15, 1969

3,439,186

DIODE TRANSISTOR LOGIC CIRCUIT HAVING IMPROVED TURN-ON DRIVE

Walter C. Seelbach, Scottsdale, Ariz., assignor to Motorola, Inc., Franklin Park, Ill., a corporation of Illinois Filed Oct. 18, 1965, Ser. No. 497,292
Int. Cl. H03k *19/36, 19/34, 19/40*
U.S. Cl. 307—214 10 Claims

ABSTRACT OF THE DISCLOSURE

A diode tranistor logic circuit including a control semiconductor device interconnected between an input circuit and an output semiconductor device. The control semiconductor device is responsive to a predetermined binary input signal condition at the input circuit for controlling the conductive state of the output semiconductor device. Impedance means are connected between a power supply terminal and the output semiconductor device, and a node within the impedance means exists at one or the other of two discrete bias potentials. A feedback semiconductor device interconnects the impedance means and the control semiconductor device and is responsive to one of the two bias potentials at the node to provide turn-on drive current through the control semiconductor device to the output semiconductor device. When the output semiconductor device is driven into saturation and the current flow through the impedance means drops the bias potential at the node to the other of its two discrete values, the feedback semiconductor device is biased substantially non-conducting.

This invention relates to a logic circuit and in particular to a diode transistor logic gate circuit having fast turn-on time and low standby current requirements.

In many applications where diode transistor logic gate circuits are used it is desired to turn on the circuit gate rapidly and to drive large numbers of output circuits. In order to achieve a rapid turn-on it is necessary that a large amount of current be available to charge the capacitance of the gate circuit and to charge capacitances which may be present in the load. The current handling capabilities of conventional logic gate circuits can be increased by decreasing the resistance of the circuits coupling the gate control transistors to the power supply. However, achieving a rapid turn-on by this method has limitations. Decreasing the size of the resistance of the circuit increases the standby power used by the gate circuit to a much larger value than that required to maintain the gate in its turned on condition. Where large numbers of the gate circuits are used or in applications where the power supply is limited, the large amount of standby power required makes the use of the gate circuits difficult. Additionally, where the circuit is manufactured in a monolithic integrated circuit form, it is desirable to keep the power dissipated at a minimum value.

It is therefore an object of this invention to provide a diode transistor logic gate circuit which will supply sufficient power for a rapid turn-on of the gate without having a large standby power requirement.

Another object of this invention is to provide a diode transistor logic gate circuit providing sufficient power for rapid turn-on of the gate and in which the standby power available is automatically increased as the output power requirements of the gate are increased.

A feature of this invention is the provision of a diode transistor logic gate circuit having a feedback transistor coupling turn-on current to the output gate transistor and biased to provide sufficient current during the turn-on period to permit rapid turn-on of the gate circuit. The feedback transistor is coupled to the output transistor and is responsive to the current therethrough when the output transistor is in its conductive state whereby the feedback transistor changes its conductive state so that the gate circuit standby current requirements are kept at a minimum.

Another feature of this invention is the provision of a diode transistor logic gate circuit in which the feedback transistor is coupled to the output transistor through a voltage divider circuit and in which the ratio of the voltage divider is established at a value so that the standby current output of the feedback transistor is automatically increased as the output power requirements of the gate are increased.

The invention is illustrated in drawings of which:

In practicing this invention, a diode transistor logic gate circuit is provided having an output transistor and a control transistor. Current for the control transistor and output transistor is provided by a feedback transistor. The control electrode of the feedback transistor is coupled to the output transistor through a resistor voltage divider. The feedback transistor is normally biased on by the bias voltage from the voltage divider. When an input signal is received to turn on the output transistor, drive current for the output transistor is provided by the feedback transistor through the control transistor. The flow of current through the voltage divider and the output transistor changes the bias potential applied to the control electrode of the feedback transistor so that this transistor is biased to non-conduction. Thus, the feedback transistor furnishes a large bias current for turning on the output transistor of the gate. When the gate is fully turned on the feedback transistor is biased to non-conduction so that the standby current is maintained at a low value. By selecting the proper ratio of the resistance of the voltage divider circuit the bias coupled to the control electrode of the feedback transistor is automatically changed to provide the correct amount of standby drive current depending upon the amount of load current supplied by the output transistor.

Figure 1:
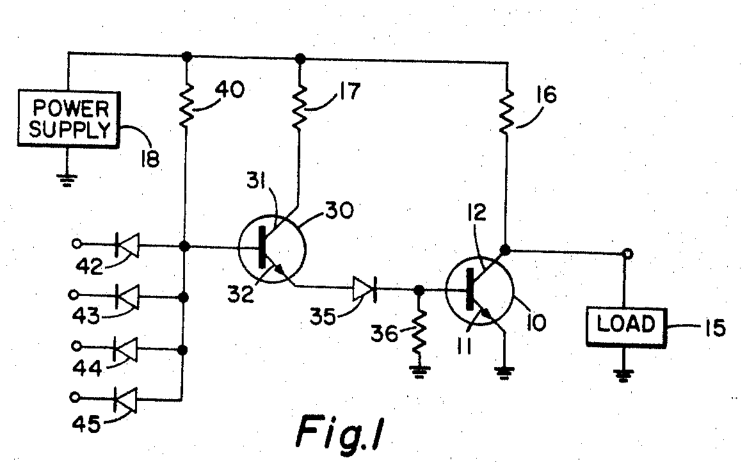
Fig.1 (PRIOR ART)
FIG. 1 is a schematic of a prior art circuit.

In FIG. 1 there is shown a schematic of a prior art diode transistor logic gate circuit. An output transistor 10 has an emitter electrode 11 coupled to a reference potential and a collector electrode 12 coupled to a load 15. Collector 12 of transistor 10 is also coupled to power supply 18 through resistor 16. Collectors 31 of control transistor 30 is coupled to power supply 18 by resistor 17. Emitter 32 of transistor 30 is coupled to base 13 of transistor 10 by diode 35. Resistor 36 is coupled between base 13 of transistor 10 and the reference potential. Resistor 40 and diodes 42 to 45 form an input logic gate circuit.

A ground potential applied to any of diodes 42 to 45 will establish base 33 at a ground potential thereby biasing transistor 30 to non-conduction. With transistor 30 non-conductive, base 13 of transistor 10 is biased so that transistor 10 is also non-conductive. When control signals are applied to diodes 42 to 45, such that all the control signals are positive, base 33 of transistor 30 is biased so that it conducts to supply a turn-on current to transistor 10.

In order to turn on transistor 10 as rapidly as possible a large drive current should be supplied to base 13 of transistor 10. The large drive current must supply the capacitance of the gate circuit and any capacitive current required by load 15. In the prior art circuit of FIG. 1, the resistance of resistor 17, coupling collector 31 of transistor 30 to power supply 18 must be low in order to provide a heavy turn-on drive current. When transistor 10 is biased to conduction the low resistance of resistor 18 would cause a heavy standby current flow. Since the standby drive current requirement is not as heavy as the turn-on current requirement, energy is wasted.

Figure 2:
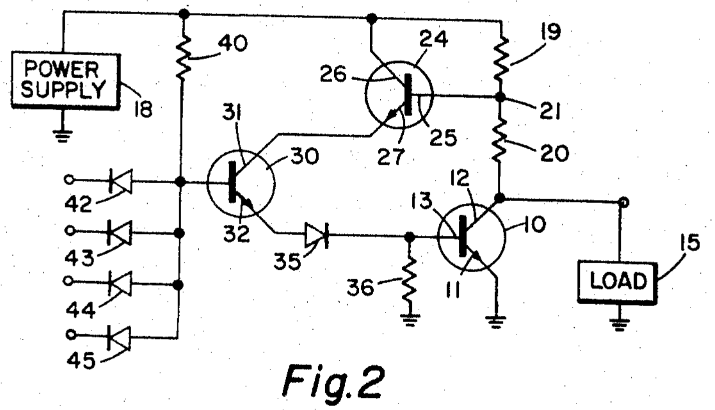
FIG. 2 is a schematic of a circuit incorporating the features of the invention.

In FIG. 2 there is shown a schematic of a diode transistor logic gate circuit incorporating the features of this invention. Identical portions of FIGS. 1 and 2 have the same reference numbers. In FIG. 2 collector 31 of transistor 30 is coupled to power supply 18 through feedback transistor 24. Resistors 19 and 20 form a series voltage divider circuit coupling collector 12 of transistor 10 to power supply 18. Junction 21 of resistors 19 and 20 is coupled to base electrode 25 of transistor 24 and emitter electrode 27 of transistor 24 is coupled to collector 31 of control transistor 30.

With output transistor 10 biased to non-conduction the bias potential appearing at junction point 21 and applied to base 25 of transistor 24 is sufficient to bias transistor 24 to conduction. Thus, when transistor 30 is biased to conduction, current flows through transistors 24 and 30 to provide a heavy turn-on current for transistor 10. Since transistors 24 and 30 are biased to conduction during this turn-on period, their resistances are low and thus the time constant of the turn-on circuit is low.

As transistor 10 turns on, the potential at collector 12 of transistor 10 decreases and the potential at point 21 also decreases. The ratio of resistors 19 and 20 can be selected so that when transistor 10 is biased to full conduction the potential at point 21 will bias trânsistor 24 to non-conduction. Under these conditions the standby drive current for transistor 10 is provided through resistor 40 and the base 33 emitter 32 diode junction of transistor 30. When transistor 10 is required to sink a small load current, this drive current is sufficient to maintain transistor 10 in the conductive state during the standby period and thus the circuit will consume little energy during this period.

If load 15 is larger, it may be necessary to maintain transistor 24 in a slightly turned-on condition so that current is provided through transistor 24 and the collector of transistor 30 as well as through resistor 40 and the base 33 emitter 32 junction of transistor 30. The ratio of the resistances of resistors 19 and 20 can be selected so that as the load current requirements and $V_{CE\ (SAT)}$ increase the bias potential at junction point 21 also increases. The current flow through transistor 24 is thereby automatically increased providing the increased drive current which is necessary to maintain transistor 10 in a fully turned-on condition.

Thus a diode transistor logic gate circuit has been provided which is suitable for construction as a monolithic integrated circuit. The gate circuit can be switched rapidly and has a low standby current drain. By proper selection of component values the standby current provided will automatically adjust for changes in the load driven by the gate.

I claim:

1. In a semiconductor logic circuit having a power supply terminal, input circuit means adapted to receive a control signal, normally nonconductive output semiconductor means, and control semiconductor means coupling the input circuit means to the output semiconductor means, the combination including, impedance means coupling the output semiconductor means to the power supply terminal, feedback semiconductor means having an input electrode coupled to the power supply terminal, a control electrode coupled to said impedance means for receiving a first bias potential therefrom when said output semiconductor means is nonconductive and an output electrode coupled to the control semiconductor means, with the control semiconductor means being responsive to the control signal to cause the output semiconductor means to become conductive whereby current flows therethrough and through said impedance means, said feedback semiconductor means being responsive to said first bias potential to supply current to the control semiconductor means and drive current to the output semiconductor means during the period in which the output semiconductor means becomes conductive, said impedance means being responsive to said flow of current therethrough to develop a second bias potential when said output semiconductor means becomes conductive, said feedback semiconductor means being responsive to said second bias potential whereby said drive current is reduced to a value sufficient to maintain conduction of the output semiconductor means.

2. The semiconductor logic circuit according to claim 1, in which the output semiconductor means, the control semiconductor means and said feedback semiconductor means are each transistor means.

3. The semiconductor logic circuit according to claim 2 in which said impedance means is a voltage divider comprising first and second resistance means series connected between the output transistor means and the power supply terminal, and said control electrode of said feedback semiconductor means is coupled to the junction of said first and second resistance means.

4. The semiconductor logic circuit according to claim 3, in which the ratio of the values of said first and second resistance means is established at a value whereby said second bias potential acts to cut off said feedback transistor means.

5. The semicondutor logic circuit according to claim 3, in which the ratio of the values of said first and second resistance means is established at a value whereby said second bias potential acts to maintain said feedback transistor means in a conductive state.

6. In a semiconductor logic circuit having a power supply, input circuit means adapted to receive a control signal, a normally non-conductive output transistor having an emitter electrode coupled to the power supply and base and collector electrodes, and a control transistor having an emitter electrode coupled to the base electrode of the output transistor, a base electrode coupled to the input circuit means and a collector electrode, the combination including, first and second resistors series connected and coupling the collector electrode of the output transistor to the power supply, a feedback transistor having a collector electrode coupled to the power supply, a base electrode coupled to the junction of said first and second resistors for receiving a first bias potential therefrom and an emitter electrode coupled to the collector electrode of the control transistor, with the control transistor being responsive to the control signal to cause the output transistor to become conductive whereby current flows therethrough and through said first and second resistors, said feedback transistor being responsive to said first bias potential to supply current to the control transistor and drive current to the output transistor during the period in which the output transistor becomes conductive, said first and second resistors being responsive to said flow of current therethrough to develop a second bias potential, said feedback transistor being responsive to said second bias potential whereby said drive current is reduced to a value sufficient to maintain conduction of the output transistor.

7. The semiconductor logic circuit according to claim 6 in which the ratio of the values of said first and second resistors is established at a value whereby said second bias potential acts to cut off said feed back transistor means.

8. The semiconductor logic circuit according to claim 6 in which the ratio of the values of said first and second resistors is established at a value whereby said second bias potential acts to maintain said feedback transistor in a conductive state.

9. The semiconductor logic circuit according to claim 6 in which the resistance of said second resistor means coupling said base electrode of said feedback transistor to the collector electrode of the output transistor is equal to zero.

10. The semiconductor logic circuit according to claim 6 in which the diode transistor logic circuit is constructed in a monolithic integrated circuit form.

References Cited

UNITED STATES PATENTS 3,183,370 5/1965 Trampel ............ 307—214

ARTHUR GAUSS, *Primary Examiner.*

D. D. FORRER, *Assistant Examiner.*

U.S. Cl. X.R.

307—215; 330—18